US012663454B2

(12) United States Patent
Gupta et al.

(10) Patent No.: US 12,663,454 B2
(45) Date of Patent: Jun. 23, 2026

(54) SEMICONDUCTOR DEVICE HAVING ELECTROMAGNETIC INTERFERENCE (EMI) SENSORS AND A SENSING CIRCUIT TO DETECT EMI ATTACKS

(71) Applicant: NXP B.V., Eindhoven (NL)

(72) Inventors: Shilpa Gupta, Rohini (IN); Hubert Martin Bode, Haar (DE); Rishi Bhooshan, Noida (IN)

(73) Assignee: NXP B.V., Eindhoven (NL)

( * ) Notice: Subject to any disclaimer, the term of this patent is extended or adjusted under 35 U.S.C. 154(b) by 181 days.

(21) Appl. No.: 18/788,375

(22) Filed: Jul. 30, 2024

(65) Prior Publication Data

US 2025/0052798 A1 Feb. 13, 2025

(30) Foreign Application Priority Data

Aug. 13, 2023 (IN) .............................. 202311054378

(51) Int. Cl.
*G01R 29/08* (2006.01)
*H10W 42/20* (2026.01)
*H10W 42/40* (2026.01)

(52) U.S. Cl.
CPC ........ *G01R 29/0878* (2013.01); *H10W 42/20* (2026.01); *H10W 42/40* (2026.01)

(58) Field of Classification Search
CPC .. G01R 29/0878; G01R 29/12; G01R 31/002; G01R 29/0814; H10W 42/20;
(Continued)

(56) References Cited

U.S. PATENT DOCUMENTS 4,758,943 A * 7/1988 Astrom ................ G05B 13/045
700/35
4,833,406 A * 5/1989 Foster .................... G01R 33/07
324/252
(Continued)

FOREIGN PATENT DOCUMENTS

WO 2009085363 A2 7/2009

OTHER PUBLICATIONS

European search report for EP # 24193801, European version of U.S. Appl. No. 18/788,375. (Year: 2024).*
(Continued)

*Primary Examiner* — Christopher P Mcandrew
(74) *Attorney, Agent, or Firm* — Joanna G. Geld

(57) ABSTRACT

A semiconductor device includes a secured circuit, an electromagnetic interference (EMI) sensor over a surface of the secured circuit, and a sensing circuit. The EMI sensor is configured to receive a reference voltage and the EMI sensor includes at least one of electric (E) field sensor or a magnetic (H) field sensor. The sensing circuit includes a hysteresis comparator and a voltage level comparator. The hysteresis comparator has a first input coupled to a first node of the EMI sensor via a low pass filter, a second input directly connected to the first node, and an output configured to provide an output indicative an EMI attack. An antenna portion of the EMI sensor includes the first node and is coupled between inputs of the voltage level comparator, in which the voltage comparator is configured to provide an output indicative of a physical tampering with the antenna portion.

20 Claims, 2 Drawing Sheets

(58) Field of Classification Search
CPC ... H10W 42/40; H10W 42/405; G06F 21/554;
G06F 21/75; G06F 21/755; G06F 21/86
USPC ........................................................ 324/149
See application file for complete search history.

(56) References Cited

U.S. PATENT DOCUMENTS

| | | | | | |
|---|---|---|---|---|---|
| 5,185,684 | A * | 2/1993 | Beihoff | ................ | G01R 15/181 |
| | | | | | 361/87 |
| 8,818,749 | B2 * | 8/2014 | Friedrich | ............. | G01R 35/005 |
| | | | | | 702/183 |
| 9,455,233 | B1 | 9/2016 | Bhooshan et al. | | |
| 10,242,955 | B2 * | 3/2019 | Arora | ................... | H10W 42/405 |
| 10,972,002 | B1 * | 4/2021 | Pelicia | .................... | H02M 3/07 |
| 2010/0181999 | A1 | 7/2010 | Sudai et al. | | |
| 2010/0211347 | A1 * | 8/2010 | Friedrich | ........... | G01R 33/0035 |
| | | | | | 324/202 |
| 2012/0201055 | A1 * | 8/2012 | Moon | ................. | H02M 1/4258 |
| | | | | | 363/21.02 |
| 2014/0111216 | A1 * | 4/2014 | Kawabe | ............... | G01R 31/396 |
| | | | | | 324/434 |
| 2014/0184314 | A1 * | 7/2014 | Takahashi | .......... | G01R 31/3833 |
| | | | | | 327/524 |
| 2018/0061780 | A1 * | 3/2018 | Arora | ................... | H10W 42/405 |
| 2019/0013281 | A1 | 1/2019 | Elenes et al. | | |
| 2019/0128937 | A1 * | 5/2019 | Choi | ..................... | G06F 1/1698 |
| 2019/0170336 | A1 * | 6/2019 | Sun | ...................... | H05B 45/345 |
| 2020/0043868 | A1 * | 2/2020 | Apte | ..................... | G06F 21/554 |
| 2020/0176044 | A1 * | 6/2020 | Lees | ................... | G06F 12/1491 |
| 2020/0200812 | A1 * | 6/2020 | Wan | ..................... | G01R 15/146 |
| 2021/0150027 | A1 * | 5/2021 | Sonntag | ................ | G06F 21/556 |
| 2021/0327239 | A1 * | 10/2021 | Falkenburg | .......... | G01N 33/004 |
| 2022/0012370 | A1 * | 1/2022 | Yang | ..................... | H03K 19/20 |
| 2023/0020049 | A1 * | 1/2023 | Wang | ................... | G01R 15/183 |

OTHER PUBLICATIONS

Aiello, "Hall-Effect Current Sensors Susceptibility to EMI: Experimental Study," website: www.mdpi.com/journal/electronics, MDPI, Electronics 2019, 8, 1310; doi:10.3390/electronics8111310, pp. 1-14.

* cited by examiner

SEMICONDUCTOR DEVICE HAVING ELECTROMAGNETIC INTERFERENCE (EMI) SENSORS AND A SENSING CIRCUIT TO DETECT EMI ATTACKS

CROSS-REFERENCE TO RELATED APPLICATIONS

This application claims the priority under 35 U.S.C. § 119 of India application No. 202311054378, filed on 13 Aug. 2023, the contents of which are incorporated by reference herein.

BACKGROUND

Field

This disclosure relates generally to semiconductor devices, and more specifically, to a semiconductor device with electromagnetic interference (EMI) sensors and a sensing circuit to detect EMI attacks.

Related Art

In many applications today, electronic systems, such as automotive devices, smart cards, digital payment systems, etc., need to be safe and secure to meet end customer needs for the security of transactions and information. Today there are various types of side channel attacks, such as, for example, EMI attacks (in which EMI probes can be used to obtain secure data from secure subsystems) and physical tampering can compromise security. Therefore, a need exists for circuits with improved ability to prevent EMI attacks and detect physical tampering.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a semiconductor device includes EMI sensors, including an electric (E) field sensor and a magnetic (H) field sensor to avoid EMI attacks of the semiconductor device, such as on a secured circuit of the semiconductor device. The EMI sensors, along with a secure voltage reference, are used to monitor and detect possible EMI attacks, as well as physical tampering with the sensors. Voltage fluctuations on the secured voltage reference can be monitored to detect attacks. In one example, the EMI sensors may include separate metal-based E and H sensors to detect any spurious or harmful EMI attacks on the semiconductor device. The EMI sensors may be implemented over the surface of any secured circuit of the semiconductor device and are used to generate a failsafe response in the case an attack is detected to prevent hacking of secured data or information.

Figure 1:
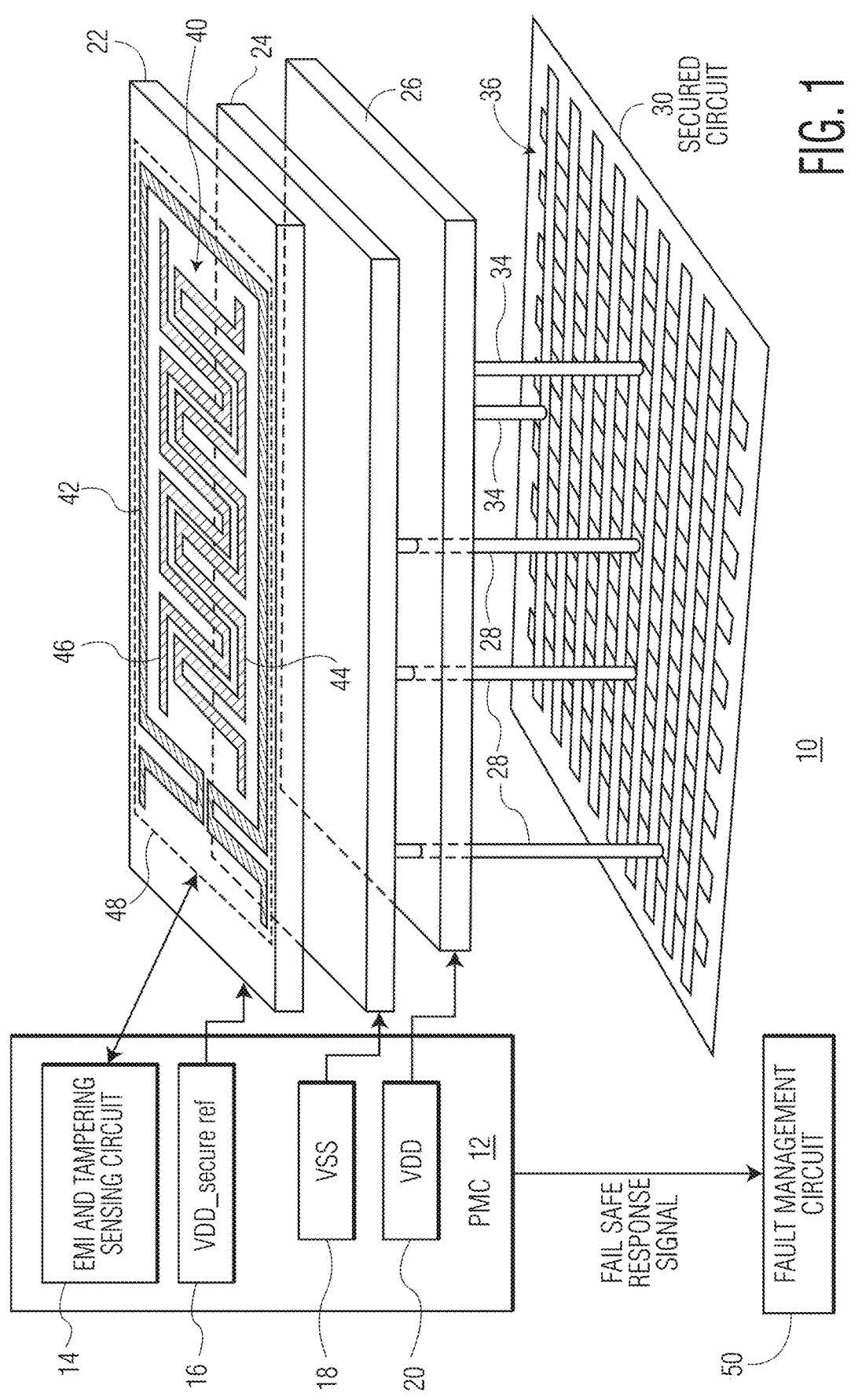
FIG. 1 illustrates, in diagrammatic form, a system on chip (SoC) having a secured circuit, an EMI sensor, and an EMI and tampering sensing circuit, in accordance with one embodiment of the present invention.

FIG. 1 illustrates a semiconductor device 10, in accordance with one embodiment of the present invention. In one embodiment, semiconductor device 10 is implemented as an SoC, and may therefore be referred to as SoC 10. SoC 10 includes a secured circuit 30, a fault management circuit 50, a power management circuit (PMC) 12, a first voltage plane 22 configured to provide a first supply voltage, a second voltage plane 24 configured to provide a second supply voltage, and a third voltage planed configured to provide a third voltage source. In one embodiment, the third supply voltage (e.g. VDD) is greater than the second supply voltage (e.g. VSS), in which the second supply voltage may be ground or 0V. The first supply voltage (e.g. Vdd_secure reference) may also be greater than the second supply voltage. Each of the voltage planes are configured to receive their corresponding supply voltages from PMC 12, in which PMC 12 includes a first voltage supply terminal 16 coupled to voltage plane 22 and configured to provide Vdd_secure reference (ref), a second voltage supply terminal 18 coupled to voltage plane 24 and configured to provide VSS, and a third voltage supply terminal 20 coupled to voltage plane 26 and configured to provide VDD. In one embodiment, PMC 12 includes one or more voltage regulators to provide the supply voltages. PMC 12 is also able to sense or monitor Vdd_secure ref through the metal plate capacitor structure formed by plane 22.

Secured circuit 30 may include any type of security system or circuitry within SoC 10. For example, in one embodiment, secured circuit 30 may include a hardware security engine (HSE), and a secure memory coupled to the HSE. The HSE may include, for example, cryptographic circuitry to encrypt or decrypt data. In one embodiment, secured circuit 30 is formed with rows of library cell circuits, and includes a power mesh grid 36 to provide VSS and VDD as needed to circuitry within secured circuit 30. Electrical conductors 28 may route VSS, as needed, to power mesh grid 36 and secured circuit 30, and electrical conductors 34 may route VDD, as needed to power mesh grid 36 and secured circuit 30. (Note that power grid 36 and the conductors between the voltage planes and power grid 36 are representative of the grid and connections, and are not intended to illustrate precise connections. Also, there may be any number of conductors, such as conductors 34 and 36, as needed, to provide the power connections.)

SoC 10 also includes sensors 48, configured to receive Vdd_secure ref and coupled to EMI and tamper sensing circuit 14. Note that EMI and tamper sensing circuit 14 may simply be referred to as sensing circuit 14. Sensors 48 include an electric field (E field) sensor 40 and a magnetic field (H field) sensor 42, in which each of these sensors may be a metal based sensor including any suitable metal. In the illustrated embodiment, sensors 48 are formed over plane 22, and is also formed over a major surface of secured circuit 30. In alternate embodiments, sensors 48 can be formed over a greater portion of SoC 10, including more than secured circuit 30, and may even be formed over a major surface of all of SoC 10. Each of E field sensor 40 and H field sensor 42 are configured to receive the Vdd_secure ref, and each of E field sensor 40 and H field sensor 42 include one or more nodes coupled to sensing circuit 14 of PMC 12. Any EMI attacks to SoC 10 would result in changes to the voltage on the Vdd_secure ref supply network, which is sensed by PMC 12. In response to such changes, PMC 12 can assert a failsafe signal to indicate a possible attack, in which this signal can be provided to, for example, fault management circuit 50. Fault management circuit 50 can be any type of system fault collector and manager, or any other master within SoC 10 and, in response to assertion of the failsafe signal, can place the system into a safe state to prevent hacking of any secure data from secured circuit 30. In one embodiment, sensing circuit 14 can also detect any physical tampering of sensors 40 and 42, in which case PMC 12 can also assert the failsafe signal in response to the physical tampering. Sensing circuit 14 will be described in more detail in reference to FIG. 2 below.

In the illustrated embodiment, H field sensor 42 is formed by a continuous metal ring which surrounds at least a portion of underlying secured circuit 30 (e.g. which mostly surrounds underlying secured circuit 30). The continuous metal ring of H field sensor 42 is located in a plane which is over and parallel to a plane which contains secured circuit 30. Although H field sensor 42 is illustrated as having a rectangular shape, it may be implemented with different shapes, such as by being more circular or oval in shape or having rounded corners. In one embodiment, a node at one end of the metal ring is connected to receive Vdd_secure ref, while a node at another end of the metal ring is connected to sensing circuit 14. As described above, the ring formed by H field sensor 42 surrounds underlying secured circuit 30, but in alternate embodiments, may surround more circuitry than just secured circuit 30. As also illustrated in FIG. 1, E field sensor 40 is formed of two interdigitated antenna portions, portion 44 and 46, located in a plane that is over and parallel to a plane containing secured circuit 30. Each antenna portion is a continuous metal line which "zig zags" or "snakes" over secured circuit 30, running parallel to, and isolated from, the other antenna portion. E field sensor 40 is formed within H field sensor 42, such that H field sensor 42 also mostly surrounds E field sensor 40 in the plane which contains both E field sensor 40 and H field sensor 42. This plane is located over and parallel to the plane which contains secured circuit 30. In this manner, E field sensor 40 is formed over most or all of underlying secured circuit 30 (in which, in alternate embodiments, may be formed over most or all of underlying secured circuit 30 and any additional portion or all of SoC 10). Note that a node of one of the portions (e.g. portion 44) is connected to receive Vdd_secure ref, while other nodes of the portions (e.g. portion 44 or 46 or both) are connected to sensing circuit 14.

Figure 2:
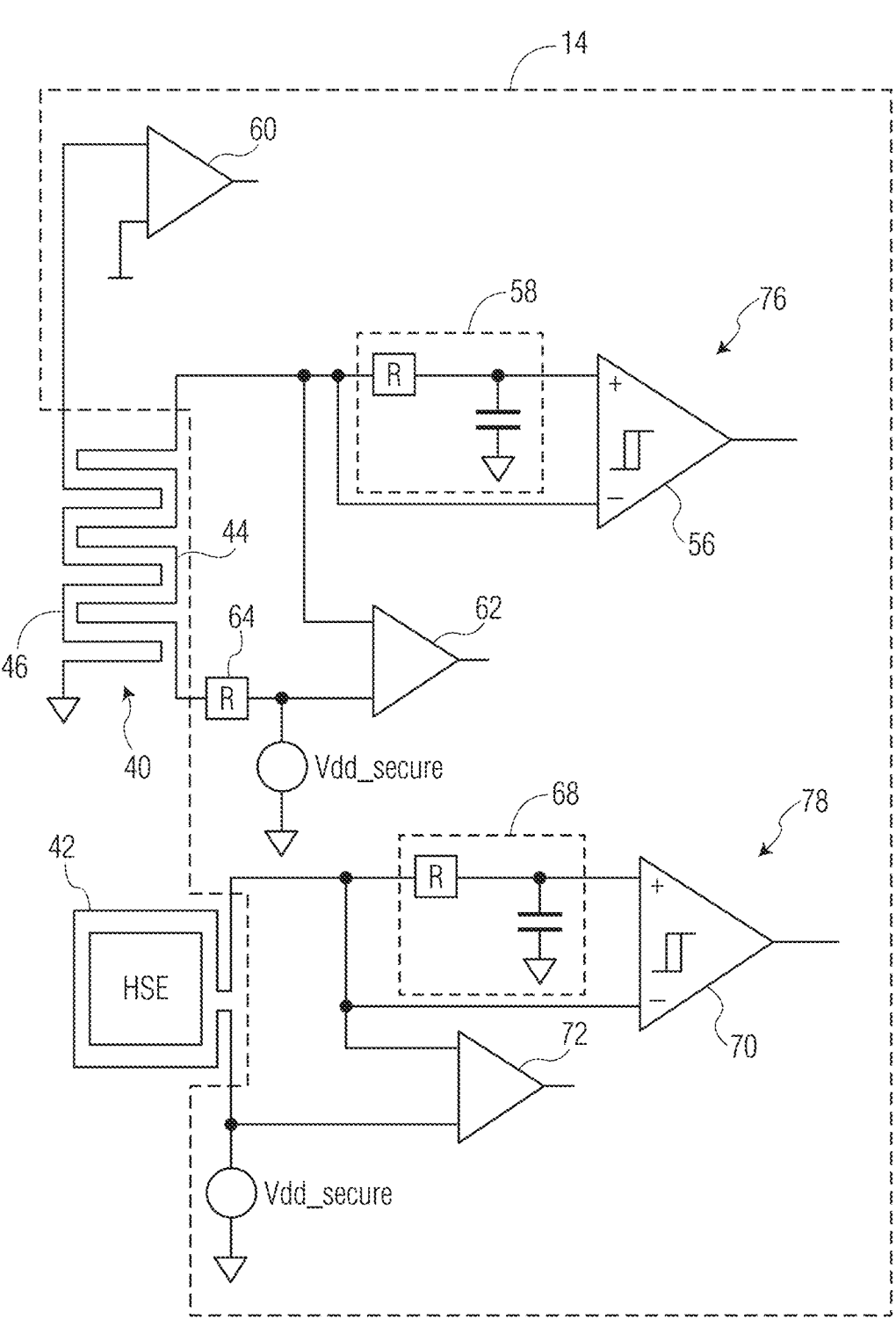
FIG. 2 illustrates, in partial block diagram and partial schematic form, the EMI and tampering sensing circuit of FIG. 1, in accordance with one embodiment of the present invention.

FIG. 2 illustrates, in partial block diagram and partial schematic form, further details of sensing circuit 14 coupled to both H field sensor 42 and E field sensor 40, in accordance with one embodiment of the present invention. A first circuit portion 76 of sensor circuit 14 is coupled to E field sensor 46, and includes voltage level comparators 60 and 62, as well as a hysteresis comparator 56. Comparators 60 and 62 provide level checking for tamper detection, and hysteresis comparator 56 detects a likely EMI probing attack resulting in changes to the E field. Hysteresis comparator 56 has a first input (e.g. a non-inverting input) coupled to a first node of antenna portion 44 via a low pass filter 58, and a second input (e.g. inverting input) directly connected to the same first node of antenna portion 44. The reference voltage, Vdd_secure ref, is provided at a second node of antenna portion 44 (at an opposite end of antenna portion 44 to the first node). In this manner, hysteresis comparator 56 compares the antenna voltage on antenna portion 44 with a low pass filtered version of the antenna voltage. Low pass filter 58 includes a resistive element coupled between the first node of antenna portion 44 at the input of low pass filter 58 and the first input of comparator 56 and a capacitive element coupled between the first input of comparator 56 and VSS (e.g. ground). Note that comparator 56 is referred to as a hysteresis comparator due to the hysteresis provided by low pass filter 58. Note that the output of comparator 56 remains negated (at a logic level zero) while the inputs are equal, and so long as the antenna voltage moves slowly, comparator 56 does not overcome its threshold, causing the output to remain negated. However, when there is a spurious, fast moving voltage on the antenna voltage (such as caused by E fields with a frequency greater than the RC time constant of filter 58), the output of comparator 56 is asserted (e.g. to a logic level one), to indicate such a change in the E field.

Each of comparators 60 and 62 may be referred to as anti-tamper level-based circuits. Comparator 60 has a first input coupled to a first node of antenna portion 46 and a second input coupled to VSS (e.g. ground). A second node at the opposite end of antenna portion 46 is also coupled to VSS (e.g. ground). Therefore, note that antenna portion 46 of E field sensor 40 is coupled between the first and second inputs of comparator 60. An output of comparator 60 remains negated so long as antenna portion 46 remains physically intact. However, when it is physically compromised (e.g. scratched open), the output of comparator 60 is asserted. For example, in one embodiment, comparator 60 includes an offset which can accept small variations in signal, but once the level offset is overcome, the output of comparator 60 is asserted to indicate the physical tampering. Similarly, comparator 62 has a first input coupled to the first node of antenna portion 44, in which a second node at the opposite end of antenna portion 44 is coupled, via a resistive element 64, to a second input of comparator 62, and Vdd_secure ref is provided at the second node of antenna portion 44. Comparator 62, similar to comparator 60, detects physical tampering of antenna portion 44. An output of comparator 62 remains negated (e.g. at a logic level zero) so long as antenna portion 44 remains physical intact, but if compromised, is asserted (e.g. to a logic level one) to indicate the physical tampering.

A second circuit portion 78 of sensor circuit 14 is coupled to H field sensor 42, and includes a voltage level comparator 72, as well as a hysteresis comparator 70. Comparator 72 operates analogously to comparator 62 to provide level checking for tamper detection of sensor 42 (which may also be referred to as antenna 42). Hysteresis comparator 70 operates analogously to hysteresis comparator 56 but for H field changes rather than E field changes in order to detect a likely EMI probing attack resulting in changes to the H field. Hysteresis comparator 70 has a first input (e.g. a non-inverting input) coupled to a first node of antenna 42 via a low pass filter 68, and a second input (e.g. inverting input) directly connected to the same first node of antenna 42. The reference voltage, Vdd_secure ref, is provided at a second node of antenna 42 (at the opposite end of antenna 42 to the first node). In this manner, hysteresis comparator 70 compares the antenna voltage on antenna 42 with a low pass filtered version of the antenna voltage. Low pass filter 68 includes a resistive element coupled between the first node of antenna 42 at the input of low pass filter 68 and the first input of comparator 70 and a capacitive element coupled between the first input of comparator 70 and VSS (e.g. ground). Note that comparator 70 is referred to as a hysteresis comparator due to the hysteresis provided by low pass filter 68. Note that the output of comparator 70 remains negated (at a logic level zero) while the inputs are equal, and so long as the antenna voltage moves slowly, comparator 70 does not overcome its threshold, causing the output to remain negated. However, when there is a spurious, fast moving voltage on the antenna voltage (such as caused by H fields with a frequency greater than the RC time constant of filter 68), the output of comparator 70 is asserted (e.g. to a logic level one), to indicate such a change in the H field. Note that the hysteresis comparators for E sensor 40 and H sensor 42 are capable of differentiating an EMI attack versus internal E and H fluctuations due to switching currents.

Comparator 72 may also be referred to as an anti-tamper level-based circuit. Comparator 72 has a first input coupled to a first node at a first end of antenna 42 and a second input coupled to a second node of antenna 42, at a second and opposite end of antenna 42 to the first node. Therefore, note that antenna 42 (i.e. the H field sensor) is coupled between the first and second inputs of comparator 72. An output of comparator 72 remains negated (e.g. at a logic level zero) so long as antenna 42 remains physically intact. However, when it is physically compromised (e.g. scratched open), the output of comparator 72 is asserted (e.g. to a logic level one). For example, in one embodiment, comparator 72 also includes an offset which can accept small variations in signal, but once the level offset is overcome, the output of comparator 72 is asserted to indicate the physical tampering.

In one embodiment, any assertion of any output of the hysteresis comparators 56 or 70, or of the anti-tamper circuits (comparator 60, 62, or 72), an EMI attack may be indicated, either due to an EMI probing attack which affects the E or H fields or due to physical tampering of any of the antennas (e.g., 44, 46, or 42). In response to the indication of the EMI attack, PMC 12 can assert the failsafe signal. In one embodiment, sensing circuit 14 includes both portions 76 and 78 in order to be able to detect either an EMI attack of the E field or the H field, and to be able to detect any physical tampering of the E field sensor or H field sensor. Alternatively, sensor circuit 14 may include only one of portions 76 and 78.

Therefore, by now it should be appreciated that there has been provided an SoC (or semiconductor device) with E field and H field sensing circuits which may be used to detect EMI attacks. In one embodiment, a sensing circuit monitors the E field and H field sensors to detect EMI attacks and includes anti-tamper circuits to detect physical tampering with the sensors. In this manner, EMI attacks or physical tampering can be detected. In one embodiment, upon detection of such activity, a failsafe response is asserted in which, in response to assertion of the failsafe response, the SoC can be placed in a safe state to prevent hacking of any secure data or information from the SoC.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture for a secured circuit, PMC, and core, this exemplary architecture is presented merely to provide a useful reference in discussing various aspects of the invention. For example, in alternate embodiments, the layout may differ and the SoC may include more or fewer circuits or modules. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of SoC 10 are circuitry located on a single integrated circuit or within a same device. Alternatively, SoC 10 may not be a single SoC but may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, each of the E field and H field sensors may include different shapes formed over the secured circuit which allow for detection of changes in the E field or H field, respectively. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In one embodiment, a semiconductor device includes a secured circuit; an electromagnetic interference (EMI) sensor over a surface of the secured circuit, wherein the EMI sensor is configured to receive a reference voltage and the EMI sensor comprises at least one of an electric (E) field sensor or a magnetic (H) field sensor; and a sensing circuit coupled to the EMI sensor. The sensing circuit includes a hysteresis comparator having a first input coupled to a first node of the EMI sensor via a low pass filter and having a second input directly connected to the first node, and an output configured to provide an output indicative an EMI attack; and a voltage level comparator, wherein an antenna portion of the EMI sensor includes the first node and is coupled between inputs of the voltage level comparator, the voltage level comparator having an output configured to provide an output indicative of a physical tampering with the antenna portion. In one aspect, the EMI sensor includes the E field sensor, wherein the E field sensor has a first antenna portion isolated from and parallel to a second antenna portion, and the first node of the E field sensor is located at a first end of the first antenna portion. In a further aspect, a second node at a second end of the first antenna portion, opposite the first end, is configured to receive the reference voltage. In yet a further aspect, the voltage level comparator has a first input coupled to the first node of the first antenna portion and a second input coupled to the second node of the first antenna portion. In another further aspect of the above embodiment, each of the first and second antenna portions is a continuous metal line. In a further aspect, the first and second antenna portions zig zag within a plane that is parallel to a plane containing the secured circuit. In another further aspect of the above embodiment, the sensing circuit includes a second voltage level comparator, wherein the first antenna portion is coupled between inputs of the voltage level comparator and the second antenna portion is coupled between inputs of the second voltage level comparator. In yet a further aspect, the output of the voltage level comparator is configured to provide an output indicative of a physical tampering of the first antenna portion, and the second voltage level comparator has an output configured to provide an output indicative of a physical tampering of the second antenna portion. In another further aspect of the above embodiment, the EMI sensor comprises the E field sensor and the H field sensor, wherein the H field sensor includes an antenna which surrounds at least a portion of the E field sensor within a plane containing both the E field sensor and the H field sensor. In a further aspect, the first input of the hysteresis comparator is coupled to a first node of the E field sensor via the low pass filter and the second input of the hysteresis comparator is directly connected to the first node of the E field sensor, and the output of the hysteresis comparator is configured to provide an output indicative of the EMI attack in response to a change in an E field, and the first antenna portion of the E field sensor is coupled between input of the voltage level comparator, and the output of the voltage level comparator is configured to provide an output indicative of a physical tampering of the first antenna portion. In yet a further aspect, the semiconductor device further includes a second hysteresis comparator having a first input coupled to a first node of the H field sensor via a low pass filter and having a second input directly connected to the first node of the H field sensor, and an output configured to provide an output indicative of an EMI attack in response to a change in an H field; and a second voltage level comparator, wherein the antenna of the H field sensor is coupled between inputs of the second voltage level comparator, the second voltage level comparator having an output configured to provide an output indicative of a physical tampering with the antenna of the H field sensor. In another aspect of the above embodiment, the EMI sensor includes the H field sensor, wherein the H field sensor includes an antenna portion which surrounds at least a portion of the secured circuit in a plane parallel to a plane containing the secured circuit. In a further aspect, the H field sensor includes a continuous metal line, wherein the first node is located at a first end of the continuous metal line and a second node is located at a second end of the continuous metal line, opposite the first end, wherein the first node and the second node are coupled to inputs of the voltage level comparator.

In another embodiment, a semiconductor device includes a secured circuit; an electric field (E field) sensor; a magnetic field (H field) sensor, wherein the E field sensor and the H field sensor are both a plane that is over and parallel to a plane containing the secured circuit, wherein each of the E field sensor and the H field sensor is configured to receive a reference voltage; and a sensing circuit coupled to the H field sensor and the E field sensor, the sensing circuit includes a first hysteresis comparator configured to compare a first antenna voltage at a first node of the E field sensor to a filtered version of the first antenna voltage and provide an output indicative of an electromagnetic interference (EMI) attack due to an E field fluctuation; and a second hysteresis comparator configured to compare a second antenna voltage at a first node of the H field sensor to a filtered version of the second antenna voltage and provide an output indicative an electromagnetic interference (EMI) attack due to an H field fluctuation. In one aspect, the semiconductor device further includes a first voltage level comparator, wherein an antenna portion of the E field sensor is coupled between inputs of the first voltage level comparator, the first voltage level comparator configured to provide an output indicative of a physical tampering with the antenna portion of the E field sensor; and a second voltage level comparator, wherein an antenna portion of the H field sensor is coupled between inputs of the second voltage level comparator, the second voltage level comparator configured to provide an output indicative of a physical tampering with the antenna portion of the H field sensor. In yet a further aspect, the semiconductor device further includes a power management circuit (PMC) having the sensing circuit, wherein the PCM is configured to assert a failsafe indicator when at least one of the output of the first hysteresis comparator is asserted to indicate the EMI attack due to the E field fluctuation, the output of the second hysteresis comparator is asserted to indicate the EMI attack due to the H field fluctuation, the output of the first voltage level comparator is asserted to indicate the physical tampering with the antenna portion of the E field sensor, or the output of the second voltage level comparator is asserted to indicate the physical tampering with the antenna portion of the H field sensor. In yet an even further aspect, the semiconductor device is configured to enter a safe state in response to assertion of the failsafe indicator. In another further aspect, the E field sensor has a first antenna portion isolated from and parallel to a second antenna portion, and the first node of the E field sensor is located at a first end of the first antenna portion, and the H field sensor surrounds at least a portion of the first and second antenna portions of the E field sensor in the plane that is over and parallel to the plane containing the secured circuit. In a further aspect, each of the first and second antenna portions and the H field sensor include continuous metal lines, and the first and second antenna portions zig zag over the secure circuit. In another further aspect, the first antenna portion of the E field sensor is coupled between inputs of the first voltage level comparator such that the output of the first voltage level comparator is indicative of a physical tampering with the first antenna portion of the E field sensor, and the semiconductor device further includes a third voltage level comparator, wherein the second antenna portion of the E field sensor is coupled between inputs of the third voltage level comparator, the third voltage level comparator configured to provide an output indicative of a physical tampering with the second antenna portion of the E field sensor.

What is claimed is:

1. A semiconductor device, comprising:
a secured circuit;
an electromagnetic interference (EMI) sensor over a surface of the secured circuit, wherein the EMI sensor is configured to receive a reference voltage and the EMI sensor comprises at least one of an electric (E) field sensor or a magnetic (H) field sensor; and
a sensing circuit coupled to the EMI sensor, comprising:
a hysteresis comparator having a first input coupled to a first node of the EMI sensor via a low pass filter and having a second input directly connected to the first node, and an output configured to provide an output indicative an EMI attack; and
a voltage level comparator, wherein an antenna portion of the EMI sensor includes the first node and is coupled between inputs of the voltage level comparator, the voltage level comparator having an output configured to provide an output indicative of a physical tampering with the antenna portion.

2. The semiconductor device of claim 1, wherein the EMI sensor comprises the E field sensor, wherein the E field sensor has a first antenna portion isolated from and parallel to a second antenna portion, and the first node of the E field sensor is located at a first end of the first antenna portion.

3. The semiconductor device of claim 2, wherein a second node at a second end of the first antenna portion, opposite the first end, is configured to receive the reference voltage.

4. The semiconductor device of claim 3, wherein the voltage level comparator has a first input coupled to the first node of the first antenna portion and a second input coupled to the second node of the first antenna portion.

5. The semiconductor device of claim 2, wherein each of the first and second antenna portions is a continuous metal line.

6. The semiconductor device of claim 5, wherein the first and second antenna portions zig zag within a plane that is parallel to a plane containing the secured circuit.

7. The semiconductor device of claim 2, wherein the sensing circuit comprises:
a second voltage level comparator, wherein the first antenna portion is coupled between inputs of the voltage level comparator and the second antenna portion is coupled between inputs of the second voltage level comparator.

8. The semiconductor device of claim 7, wherein the output of the voltage level comparator is configured to provide an output indicative of a physical tampering of the first antenna portion, and the second voltage level comparator has an output configured to provide an output indicative of a physical tampering of the second antenna portion.

9. The semiconductor device of claim 2, wherein the EMI sensor comprises the E field sensor and the H field sensor, wherein the H field sensor includes an antenna which surrounds at least a portion of the E field sensor within a plane containing both the E field sensor and the H field sensor.

10. The semiconductor device of claim 9, wherein:
the first input of the hysteresis comparator is coupled to a first node of the E field sensor via the low pass filter and the second input of the hysteresis comparator is directly connected to the first node of the E field sensor, and the output of the hysteresis comparator is configured to provide an output indicative of the EMI attack in response to a change in an E field, and
the first antenna portion of the E field sensor is coupled between input of the voltage level comparator, and the output of the voltage level comparator is configured to provide an output indicative of a physical tampering of the first antenna portion.

11. The semiconductor device of claim 10, further comprising:
a second hysteresis comparator having a first input coupled to a first node of the H field sensor via a low pass filter and having a second input directly connected to the first node of the H field sensor, and an output configured to provide an output indicative of an EMI attack in response to a change in an H field; and
a second voltage level comparator, wherein the antenna of the H field sensor is coupled between inputs of the second voltage level comparator, the second voltage level comparator having an output configured to provide an output indicative of a physical tampering with the antenna of the H field sensor.

12. The semiconductor device of claim 1, wherein the EMI sensor comprises the H field sensor, wherein the H field sensor includes an antenna portion which surrounds at least a portion of the secured circuit in a plane parallel to a plane containing the secured circuit.

13. The semiconductor device of claim 12, wherein the H field sensor includes a continuous metal line, wherein the first node is located at a first end of the continuous metal line and a second node is located at a second end of the continuous metal line, opposite the first end, wherein the first node and the second node are coupled to inputs of the voltage level comparator.

14. A semiconductor device, comprising:
a secured circuit;
an electric field (E field) sensor;
a magnetic field (H field) sensor, wherein the E field sensor and the H field sensor are both a plane that is over and parallel to a plane containing the secured circuit, wherein each of the E field sensor and the H field sensor is configured to receive a reference voltage; and
a sensing circuit coupled to the H field sensor and the E field sensor, comprising:
a first hysteresis comparator configured to compare a first antenna voltage at a first node of the E field sensor to a filtered version of the first antenna voltage and provide an output indicative of an electromagnetic interference (EMI) attack due to an E field fluctuation; and
a second hysteresis comparator configured to compare a second antenna voltage at a first node of the H field sensor to a filtered version of the second antenna voltage and provide an output indicative an electromagnetic interference (EMI) attack due to an H field fluctuation.

15. The semiconductor device of claim 14, further comprising:
a first voltage level comparator, wherein an antenna portion of the E field sensor is coupled between inputs of the first voltage level comparator, the first voltage level comparator configured to provide an output indicative of a physical tampering with the antenna portion of the E field sensor; and
a second voltage level comparator, wherein an antenna portion of the H field sensor is coupled between inputs of the second voltage level comparator, the second voltage level comparator configured to provide an output indicative of a physical tampering with the antenna portion of the H field sensor.

16. The semiconductor device of claim 15, further comprising:

a power management circuit (PMC) comprising the sensing circuit, wherein the PCM is configured to assert a failsafe indicator when at least one of the output of the first hysteresis comparator is asserted to indicate the EMI attack due to the E field fluctuation, the output of the second hysteresis comparator is asserted to indicate the EMI attack due to the H field fluctuation, the output of the first voltage level comparator is asserted to indicate the physical tampering with the antenna portion of the E field sensor, or the output of the second voltage level comparator is asserted to indicate the physical tampering with the antenna portion of the H field sensor.

17. The semiconductor device of claim 16, wherein the semiconductor device is configured to enter a safe state in response to assertion of the failsafe indicator.

18. The semiconductor device of claim 15, wherein the E field sensor has a first antenna portion isolated from and parallel to a second antenna portion, and the first node of the E field sensor is located at a first end of the first antenna portion, and the H field sensor surrounds at least a portion of the first and second antenna portions of the E field sensor in the plane that is over and parallel to the plane containing the secured circuit.

19. The semiconductor device of claim 18, wherein each of the first and second antenna portions and the H field sensor comprise continuous metal lines, and the first and second antenna portions zig zag over the secure circuit.

20. The semiconductor device of claim 18, wherein the first antenna portion of the E field sensor is coupled between inputs of the first voltage level comparator such that the output of the first voltage level comparator is indicative of a physical tampering with the first antenna portion of the E field sensor, the semiconductor device further comprising:
a third voltage level comparator, wherein the second antenna portion of the E field sensor is coupled between inputs of the third voltage level comparator, the third voltage level comparator configured to provide an output indicative of a physical tampering with the second antenna portion of the E field sensor.

* * * * *